United States Patent
Bajwa et al.

(10) Patent No.: US 10,027,286 B2
(45) Date of Patent: Jul. 17, 2018

(54) SYSTEMS AND METHODS TO CONTROL TRANSIMPEDANCE AMPLIFIER

(71) Applicant: Litrinium, Inc., Aliso Viejo, CA (US)

(72) Inventors: Najabat Hasnain Bajwa, Aliso Viejo, CA (US); Mikhail Barashenka, Aliso Viejo, CA (US); Hanqing Qian, Aliso Viejo, CA (US)

(73) Assignee: LITRINIUM, INC., Aliso Viejo, CA (US)

( * ) Notice: Subject to any disclaimer, the term of this patent is extended or adjusted under 35 U.S.C. 154(b) by 0 days.

(21) Appl. No.: 15/616,820

(22) Filed: Jun. 7, 2017

(65) Prior Publication Data

US 2017/0338780 A1 Nov. 23, 2017

Related U.S. Application Data

(63) Continuation-in-part of application No. 15/461,431, filed on Mar. 16, 2017, now Pat. No. 9,899,797.

(60) Provisional application No. 62/309,270, filed on Mar. 16, 2016, provisional application No. 62/309,243, filed on Mar. 16, 2016.

(51) Int. Cl.
| | |
|---|---|
| *H03F 1/00* | (2006.01) |
| *H03F 1/42* | (2006.01) |
| *H03G 3/30* | (2006.01) |
| *H03F 3/08* | (2006.01) |
| *H04B 10/50* | (2013.01) |
| *H04B 10/564* | (2013.01) |
| *H04B 10/572* | (2013.01) |

(52) U.S. Cl.
CPC .............. *H03F 1/42* (2013.01); *H03F 3/087* (2013.01); *H03G 3/3084* (2013.01); *H04B 10/503* (2013.01); *H04B 10/564* (2013.01); *H03F 2200/408* (2013.01); *H04B 10/572* (2013.01)

(58) Field of Classification Search
CPC ...... H03F 1/42; H03F 3/087; H03F 2200/408; H03G 3/3084; H04B 10/503; H04B 10/564; H04B 10/572
See application file for complete search history.

(56) References Cited

U.S. PATENT DOCUMENTS

| | | |
|---|---|---|
| 6,031,660 A | 2/2000 | Park et al. |
| 6,657,488 B1 | 12/2003 | King et al. |
| 7,088,174 B2 | 8/2006 | Glass |
| 7,259,628 B2 | 8/2007 | Huang et al. |
| 7,532,653 B2 | 5/2009 | Anderson et al. |
| 7,657,191 B2 | 2/2010 | Killmeyer et al. |
| 8,903,246 B2 | 12/2014 | Wieland et al. |
| 9,083,467 B2 | 7/2015 | Ide et al. |
| 9,083,468 B2 | 7/2015 | Zheng et al. |
| 2004/0145799 A1 | 7/2004 | Sedic |
| 2008/0084904 A1 | 4/2008 | Hayashi |
| 2012/0217381 A1* | 8/2012 | Tatsumi ................. H03F 3/087 250/214 A |
| 2012/0263202 A1 | 10/2012 | Steinle et al. |

* cited by examiner

*Primary Examiner* — Armando Rodriguez
(74) *Attorney, Agent, or Firm* — Fish IP Law, LLP

(57) ABSTRACT

A system to program parameters of one or more stages of a transimpedance amplifier (TIA) in an optical sub-assembly (e.g. TO-can package) is disclosed. With this invention, users have the option/flexibility to discretely program any of the stages of the TIA after production of the sub-assembly, i.e. they can still change the TIA settings once the TIA has been installed in a system and the system is in use.

7 Claims, 4 Drawing Sheets

SYSTEMS AND METHODS TO CONTROL TRANSIMPEDANCE AMPLIFIER

This application is a continuation-in-part of U.S. patent application Ser. No. 15/461,431, filed Mar. 16, 2016, and also claims priority to U.S. provisional application No. 62/346,918, filed Jun. 7, 2016. Those applications, and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The field of the invention is Transimpedance Amplifiers.

BACKGROUND

The following description includes information that may be useful in understanding the present invention. It is not an admission that any of the information provided herein is prior art or relevant to the presently claimed invention, or that any publication specifically or implicitly referenced is prior art.

A Transimpedance Amplifier (TIA) is a current-to-voltage converter. In the field of fiber optics, TIAs are used to produce voltage differentials that correspond to digital data.

In optical receiver applications, a Transimpedance Amplifier (TIA) is typically housed in an optical sub-assembly (e.g. TO-can package), which is limited to 5 or 6 pins. Those pins are VDD, VSS, OUTP, OUTN, RSSI, and PINK (for 6 pin TO-cans). One problem is that the typical configuration fails to leave any of the standard pins for control interface. Without a control interface, the settings of the TIA cannot be adjusted to optimize them for a particular application and/or environment.

As used herein, the term "pin" is used to denote an electrical connection, of whatever physical nature. Thus, the term "pin" should be interpreted herein to also include connections physically configured as pads.

Some previous devices have used additional bond-pads for controlling a few of the settings. However, the number of additional bond-pads for control settings is limited to 2 to 4 pads because of constraints in the size/area of the chip. Thus, the number of different settings is limited to 2 to 4, which constrains optimization, and in some cases/applications limits the use of the TIA.

When driving lasers, control circuits frequently need to adjust the input in order to compensate for changes in the environment. For example, U.S. Pat. No. 8,903,246 to Wieland devotes some sub-assembly pins to operating a control interface inside a sub-assembly. However, diverting use of those pins from conventional functionalities to control functions eliminates those conventional functionalities.

US 2004/0145799 to Sedic teaches a system that adjusts a transimpedance amplifier (TIA) with a controller that communicates a selected mode of operation to the TIA. Each selected mode can adjust at least one of the TIA's operational settings, such as a transimpedance gain, bandwidth, DC offset, signal rise and fall time, power consumption, and output impedance. Sedic's system, however, requires a controller to be pre-configured for operation modes, and does not allow for fine-tuning of each of the settings independently from one another, which may be necessary for unforeseen needed modifications to a TIA.

Thus, there is still a need for systems and methods that can modify functioning of a TIA for different conditions and/or applications, without sacrificing conventional functionality of the existing pins/pads.

SUMMARY OF THE INVENTION

The inventive subject matter provides apparatus, systems and methods in which operating parameters of one or more stages of a TIA are controlled through existing pins and/or pads of an optical sub-assembly. In some embodiments, some of the pins may be used in a dual use, for example by using an output pin as an input pin as well, or by overlaying two signals into an input pin. Such dual uses make it possible for one or more parameters of a stage of the TIA to be adjusted. Such adjustments can be made at any time, such as before packaging or after the optical sub-assembly has been installed in a system (e.g. a mother board) without needing to alter conventional functions that the pins might otherwise have. As used herein, a sub-assembly is an integrated unit Contemplated optical sub-assemblies have at least 6 pins, for example a VDD pin, a VSS pin, an OUTP pin, an OUTN pin, an RSSI pin, and a PINK pin. In preferred embodiments, one or both of the output pins OUTP, and OUTN are used for both signal data output and to provide control signals to alter parameters of the TIA. In other embodiments, one of the output pins is coupled to a serial interface, such as an inter-integrated circuit ($I^2C$), to allow for a plurality of discrete programming signals to be sent through a single pin. Although use of other pins are contemplated, the OUTP and OUTN pins are preferably utilized for dual use. As used herein, a sub-assembly that allows for "discrete" programming of various stages of a TIA allows for a first stage to be programmed independently from a second stage of the TIA, without any dependencies.

It is, however, also contemplated that other pins could be used in a dual purpose manner. For example, pins used as a receive signal indicator, or for external bias control, could be additionally be used for control. In other embodiments, a stage of the TIA could comprise a pad that is utilized to transmit control signals to the TIA. Such pads do not need to be configured to have a dual use.

Contemplated stages of a TIA include a photodiode cathode voltage generator, a bandwidth adjustment amplifier, a gain adjustment amplifier, a slice level adjustment block, a polarity switch, and a variable resistor. Functionalities contemplated to be controlled via such inputs include input slice level adjustment, bandwidth optimization, output de-emphasis control, gain adjustment, max output amplitude, power dissipation, PINK voltage, output resistance, and output polarity.

Control signals are preferably sent to the TIA's control interface using a digital signal. The signal can be generated in any suitable manner, including by a $I^2C$ or another suitable microcontroller.

The technical effects of the inventive subject matter thus includes (a) allowing many settings of a TIA (many more than 10) to be discretely programmed at once, and (b) programming of a TIA after packaging, or while the TIA is installed in the system/in use, all without adding additional control pins and without losing conventional functionality of existing pins.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
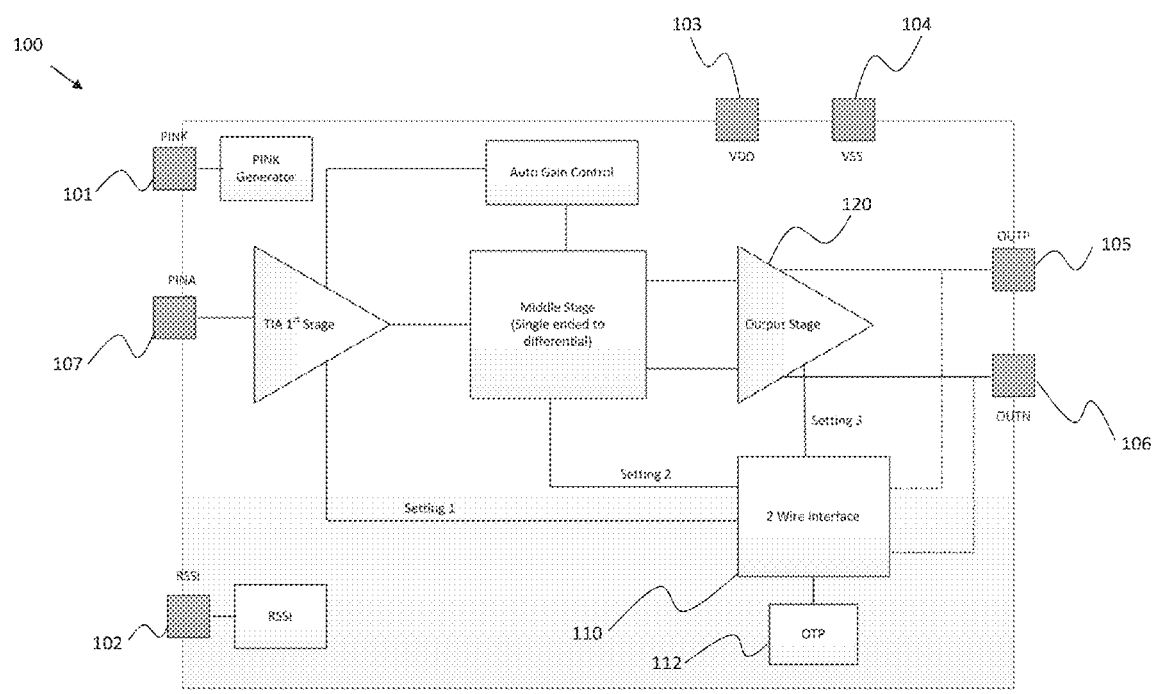
FIG. 1 is a block diagram of a contemplated sub-assembly.

FIG. 1 generally depicts a sub-assembly 100 depicted as a TO-can package having a PINK pin 101, an RSSI pin 102, a VDD pin 103, a VSS pin 104, an OUTP pin 105, and an OUTN pin 106. PINA 107 is shown as the input to the first stage of the TIA circuit in sub-assembly 100. While more pins are contemplated, a typical TO-can package for a transimpedance amplifier (TIA) used for optical receiver applications are typically limited to only 5 or 6 pins (without a PINK for a 5 pin embodiment). Here, the OUTP pin 105 and the OUTN pin 106 are coupled both to the output stage 120 of sub-assembly 100 and also to the 2-wire input interface 110 that controls parameters of multiple stages of the TIA circuit. Such an embodiment allows parameters of a TIA to be programmed at any point, for example after the sub-assembly is installed on a motherboard. By using a digital interface, such as an I²C, more than 10 parameters could be controlled and altered using one or both pins of OUTP pin 105 and OUTN pin 106.

While the 2 wire interface is currently shown as coupled to OUTP pin and an OUTN pin, the programming interface could be coupled to more or less pins, or could even be coupled to one or more bonding pads (not shown) of the sub-assembly to provide programming functionality without needing to provide extra programming pins. Where such bonding pads are used, the bonding pads could be tied to a high source (higher than the maximum threshold level known for the pad operating in mission mode), low source (lower than the minimum threshold level known for the pad operating in mission mode), or let floating to a set value (which is detected by the stage) to set a parameter of the stage. For example the programming interface could be coupled to an RSSI output pad, and could read signals when the RSSI output pad voltage is raised to a voltage above a threshold supply voltage, which is outside the normal operation of the RSSI output pad. This allows the new sub-assembly to be installed in legacy systems, while still providing the novel programming functionality. Since 2-wire interface 110 is designed such that it does not impact the operation and performance of the main signal path between input PIN A 107 and the output pins OUTP and OUTN, 2-wire interface 110 does not impact the operation and performance of the TIA.

Preferably, 2-wire interface 110 is programmed such that operation of the 2-wire interface only occurs when sub-assembly 100 is not operating in mission mode. In preferred embodiments, 2-wire interface 110 only operates after it receives an enable sequence from the input pins OUTP 105 and OUTN 106. An exemplary enable sequence comprises bringing OUTP 105 and OUTN 106 to a common mode level (e.g. 200 mV above GND) for at least a threshold period of time (e.g. 10 ms). After receiving the enable sequence, 2-wire interface 110 could alter the parameters of the TIA in sub-assembly 100 in a variety of ways. For example, 2-wire interface 110 could receive a command to reset the default parameters stored in one-time program (OTP) memory 112, similar to resetting the firmware of a device. In other embodiments, 2-wire interface 110 could program one or more of the TIA stages via transmitting a command to change setting 1, setting 2, and/or setting 3. As shown here, 2-wire interface 110 changes parameters to alter the gain of the amplifier for TIA $1^{st}$ stage, the bandwidth of the amplifier in the middle stage, or the equalization of output stage 120, but other parameters could be altered in other embodiments.

Figure 2:
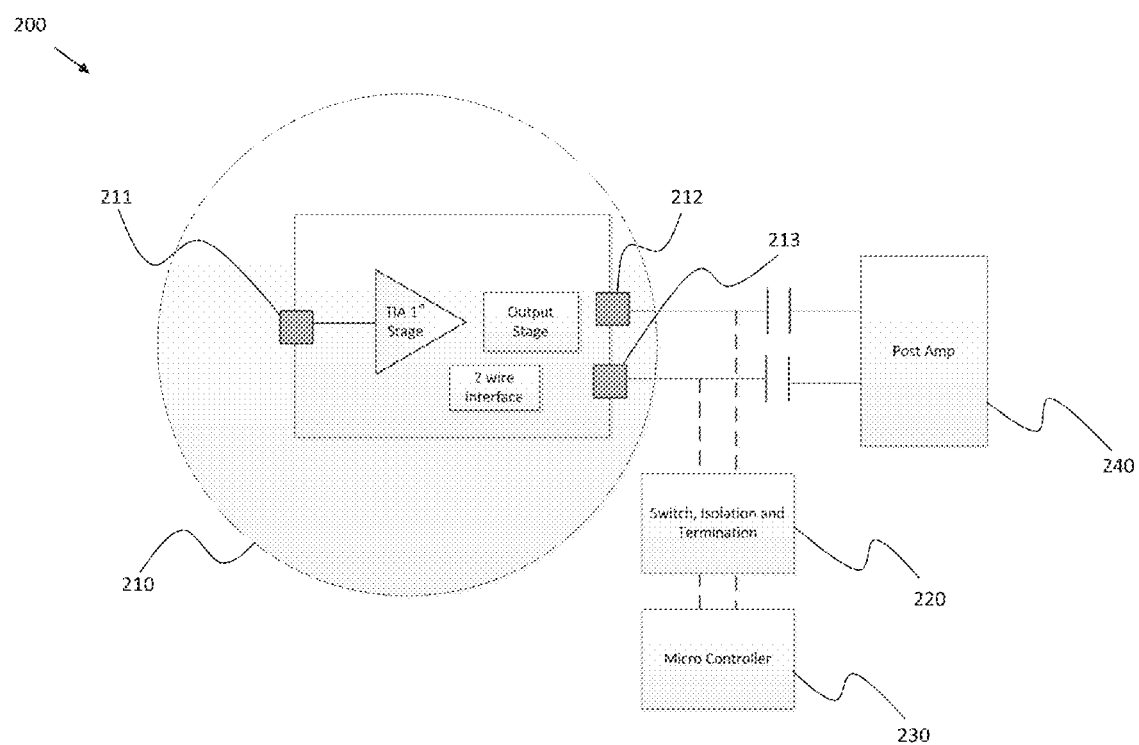
FIG. 2 is a block diagram of the contemplated sub-assembly of FIG. 1 coupled to a micro-controller.

FIG. 2 shows a motherboard section 200 with a sub-assembly 210 coupled to an output post amp 240 (e.g. a limiting amplifier), and an input microcontroller 230 that communicates with the programming interface of sub-assembly 210 via switch, isolation, and termination circuit 220. Sub-assembly 210 has an input pin 211 and output pins 212 and 213. In some embodiments, the switch, isolation, and termination circuit 220 could have a manual switch (not shown) that enables the circuit to receive commands from micro controller 230. In other embodiments, microcontroller 230 and switch, isolation, and termination circuit 220 are not installed on the motherboard at all and are only temporarily coupled to output pins 212 and 213 during programming of sub-assembly 210. For example, microcontroller 230 could be provided as a separate "TIA programming module" with leads that are temporarily coupled to pins 212 and 213 of sub-assembly 210 (or to bonding pads or to other pins in other embodiments), and are then disconnected after settings of the TIA are altered. In embodiments where the TIA is not in a TO can is embodied in a "chip on board" configuration, a serial interface could provide multiple control settings for each programmable parameter of the TIA.

Figure 3:
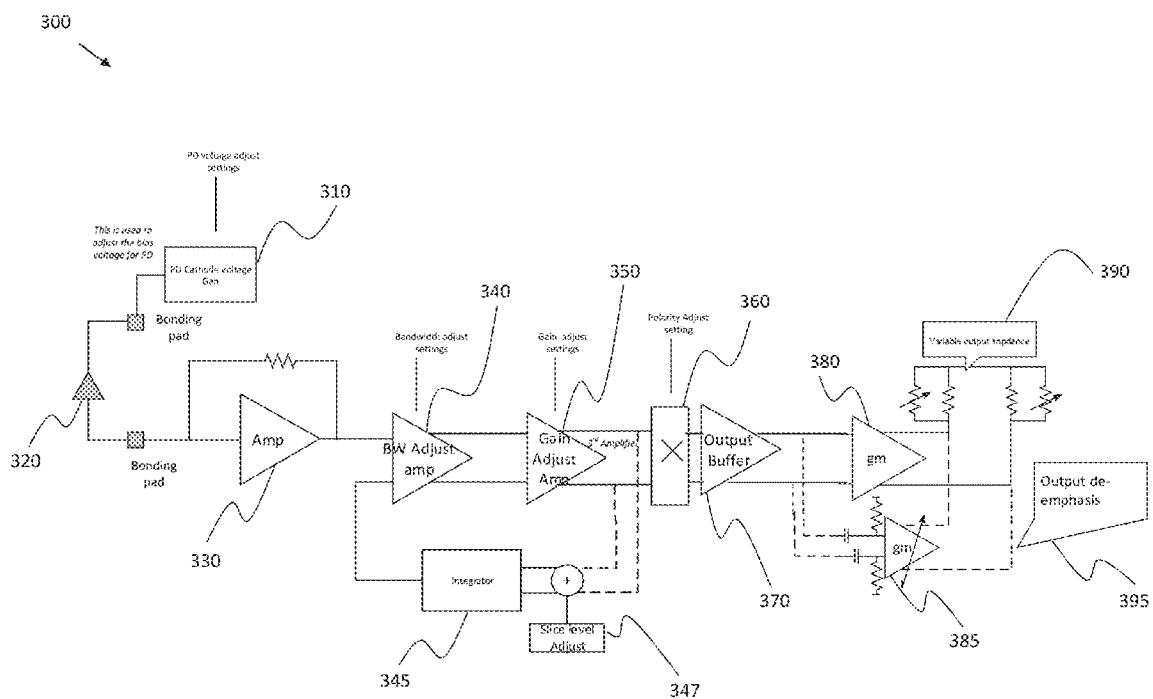
FIG. 3 is a block diagram of a transimpedance amplifier (TIA) having various parameter controls

FIG. 3 shows a block-level diagram of TIA 300 having an input photodiode 320 and an output 395 for TIA 300 in a sub-assembly. As shown, TIA 300 has a plurality of stages: a photo diode cathode voltage generator 310, a bandwidth adjustment amplifier 340, an integrator 345 with a slice level adjuster 347, a gain adjustment amplifier 350, a polarity switch 360, an output buffer amplifier 370, and resistor network impedance for output de-emphasis 390. At each stage, a programming interface can adjust the settings in a similar manner to 2-wire interface 110 in FIG. 1. This allows for the programming interface to compensate for as many as 9 different parameters as follows:

The output de-emphasis parameters for output 395 can compensate for high frequency losses in the flex PCB and/or any loss in the interface between the TIA output and CDR or LA input by adjusting the variable gain amplifier 385 as compared with to the static gain amplifier 380. Since the signals from output buffer 370 are split by initial amplifier 330 into two paths (the main path and the other path shown with dotted lines), the trans-conductance amplifiers 380 and 385 convert voltage into current and sum to provide a summed output 395.

The output resistance of either of variable resistors 390 could be altered to improve S22 at output port 395 of the TIA. This can help in improving signal integrity and reflection between the TIA output and Limiting amp input interface.

The slice level adjust 347 can be adjusted to change the reference point where the data is decided between a '1' level and '0' level. This reference point can be adjusted to optimize the bit error rate performance since the noise level could be different in '1' level vs '0' level. The slice level adjustment block 347 adds to the feedback signal and acts as an offset to the feedback signal.

The gain adjustment amplifier 350 could be altered to compensate for any process variation in the fabrication of the sub-assembly. Also it could be altered to compensate for any DC losses at output 395.

The max output amplitude could be altered by altering the TIA gain for initial amplifier 330, which can compensate for a lower or higher gain in the limiting amp stage.

The bandwidth adjustment amplifier 340 could be adjusted to optimize the bit error rate performance for a specific data rate. Parameters for the bandwidth adjustment amplifier could also be altered to compensate for lower bandwidth in photo diode 320. Bandwidth adjustment amplifier 340 converts the input signal from a single-ended signal to a differential signal by accepting 2 inputs—a signal from initial amplifier 330 and a signal from integrator 345.

The PINK voltage (i.e. bias voltage of voltage generator 310) could be adjusted to allow for different bias voltages of photodiode 320. The voltage can be adjusted to compensate for different power level or it can be used to compensate for photodiode capacitance. Altering the setting preferably is performed through the programming interface (not shown), however since a bonding pad is directly coupled to cathode voltage generator 310, a setting could be provided directly via the bonding pad in some embodiments.

The output polarity can be switched by altering parameters for polarity switch 360 between positive output and the negative output. These polarities can be swapped to ease the PCB layout.

Figure 4:
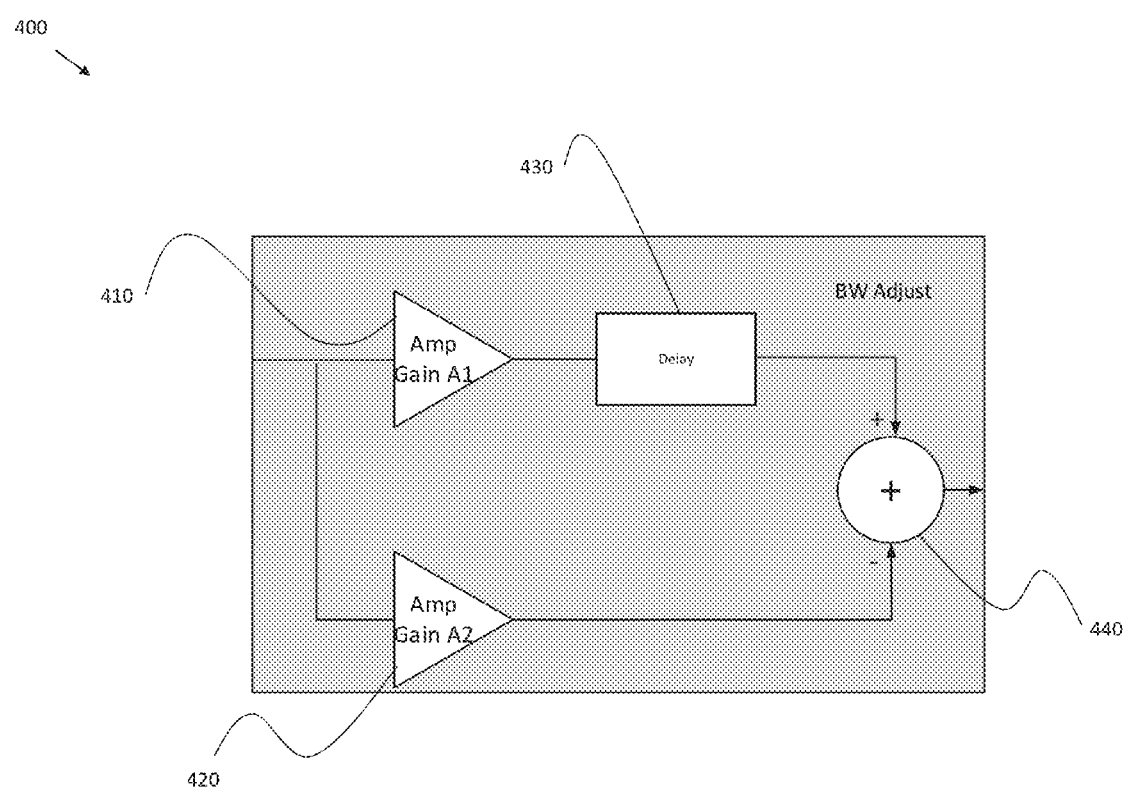
FIG. 4 is a block diagram of the bandwidth adjustment amplifier of FIG. 2.

FIG. 4 shows an exemplary bandwidth control circuitry 400 for a bandwidth adjustment amplifier, such as bandwidth adjustment amplifier 340. Bandwidth circuitry 400 has an input that is fed into both gain amplifier 410 and gain amplifier 420, which are typically identical to one another. Gain amplifier 410 is fed through a delay circuit before being fed into summation circuit 440, whereas gain amplifier 420 is fed directly into summation circuit 440. Preferably, the delay 430 can be programmed with one or more bits to adjust the bandwidth of the TIA circuit.

The disclosed sub-assembly embodiments allow a control interface to alter many settings (many more than 10) discretely and virtually simultaneously via a single series of commands. This makes it easy for the TIA to be programmed and be optimized for different conditions and applications.

With the disclosed sub-assembly embodiments, it is also possible to program the chip after the part is already packaged thus allowing to change the programmed settings while the TIA is installed in the system/in use.

The disclosed sub-assembly embodiments is an improvement on what currently exists. This invention allows the user to program the TIA after it is packaged/assembled/installed/in-use. Also it allows for the user to set multiple settings within the TIA. This invention allows a control interface so that many settings (many more than 10) can be programmed at once. This makes it easy for the TIA to be programmed and be optimized for different conditions and applications. With this invention, it is also possible to program the chip after the part is already packaged thus allowing to change the programmed settings while the TIA is installed in the system/in use.

With this invention, users have the option to program the TIA devices with many settings and users are not limited to set those setting during the assembly process.

This invention applies to any device that has a limited number of pins which prevent it from having a control interface.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. An optical sub-assembly, comprising:
    a transimpedance amplifier (TIA) comprising a plurality of stages; and
    a plurality of pins comprising a set of dual use pins, wherein the set of dual use pins are coupled to a set of outputs to a first portion of the plurality of stages and a set of inputs to a second portion of the plurality of stages,
    wherein the set of inputs discretely program parameters of the second portion of the plurality of stages,
    wherein the plurality of pins comprise a VDD pin, a VSS pin, an OUTP pin, an OUTN pin, an RSSI pin, and a PINK pin.

2. The optical sub-assembly of claim 1, wherein the set of dual use pins comprises only the OUTP pin.

3. The optical sub-assembly of claim 2, wherein the OUTP pin is coupled to a serial interface that transmits a digital signal for at least two of the set of inputs.

4. The optical sub-assembly of claim 3, wherein the serial interface comprises an inter-integrated circuit (I2C).

5. The optical sub-assembly of claim 1, wherein the set of dual use pins comprises at least two of the OUTP pin, the OUTN pin, and the RSSI pin.

6. The optical sub-assembly of claim 1, wherein the plurality of stages comprises a photodiode cathode voltage generator, a bandwidth adjustment amplifier, a gain adjustment amplifier, a slice level adjustment block, a polarity switch, and a variable resistor.

7. The optical sub-assembly of claim 1, wherein the second portion of the plurality of stages comprise at least two of a photodiode cathode voltage generator, a bandwidth adjustment amplifier, a gain adjustment amplifier, a slice level adjustment block, a polarity switch, and a variable resistor.

* * * * *